United States Patent
Chynoweth et al.

(10) Patent No.: US 10,568,193 B1
(45) Date of Patent: Feb. 18, 2020

(54) VOLATILE CHEMICAL STORAGE TANK GROUNDING SYSTEM

(71) Applicant: Lightning Eliminators & Consultants, Inc., Boulder, CO (US)

(72) Inventors: Kirk S. Chynoweth, Louisville, CO (US); Lee B. Howard, Arvada, CO (US)

(*) Notice: Subject to any disclaimer, the term of this patent is extended or adjusted under 35 U.S.C. 154(b) by 358 days.

(21) Appl. No.: 15/417,811

(22) Filed: Jan. 27, 2017

Related U.S. Application Data

(60) Provisional application No. 62/296,796, filed on Feb. 18, 2016.

(51) Int. Cl.
| | | |
|---|---|---|
| *H05F 3/00* | (2006.01) | |
| *H05F 3/02* | (2006.01) | |
| *B65D 90/46* | (2006.01) | |
| *B67D 7/32* | (2010.01) | |
| *B64D 45/02* | (2006.01) | |
| *H05K 9/00* | (2006.01) | |

(52) U.S. Cl.
CPC ............... *H05F 3/02* (2013.01); *B64D 45/02* (2013.01); *B65D 90/46* (2013.01); *B67D 7/3236* (2013.01); *H05F 3/00* (2013.01); *H05K 9/0067* (2013.01); *H05K 9/0079* (2013.01)

(58) Field of Classification Search
USPC ........................................ 361/212, 218, 220
See application file for complete search history.

(56) References Cited

U.S. PATENT DOCUMENTS

| | | | | |
|---|---|---|---|---|
| 6,490,988 | B2* | 12/2002 | Caprioglio | B63B 21/29 114/293 |
| 2013/0176656 | A1* | 7/2013 | Kaisser | B65D 90/46 361/215 |
| 2015/0239661 | A1* | 8/2015 | Morris, III | B65D 90/46 361/215 |

* cited by examiner

*Primary Examiner* — Danny Nguyen
(74) *Attorney, Agent, or Firm* — Patent Law Offices of Rick Martin, P.C.

(57) ABSTRACT

A chemical above ground non-metallic storage tank has an inner tank grounding system to minimize a risk of a spark caused by a nearby lightning strike or a static discharge. An anchor is lowered via cable to a bottom of the tank. The top of the cable is secured to an anchor attached to a roof (or side) of the tank. A ground wire is run from the anchor to ground.

16 Claims, 10 Drawing Sheets

VOLATILE CHEMICAL STORAGE TANK GROUNDING SYSTEM

CROSS REFERENCED APPLICATION

This is a non-provisional application claiming priority to provisional application Ser. No. 62/296,796 filed Feb. 18, 2016, which is incorporated by reference herein in its entity.

FIELD OF INVENTION

The present invention relates to preventing sparks inside a non-metallic tank especially during a nearby lightning strike.

BACKGROUND OF THE INVENTION

The problem of electrical discharge and subsequent explosive detonation of the ullage inside chemical storage tanks containing methane-infused fluids is becoming more widespread as the use of new non-metallic storage tanks proliferates. Such tanks are typically made of non-corrosive but otherwise insulating materials (either fiberglass resin, PVC, or similar insulating plastics), have no continuous metallic grounding conductors within or outside of the tanks, and are exposed to the electrical environment in the vicinity of lightning-producing thunderstorms. They are often used to store fluids used in hydraulic fracturing. The gas inside the tank above the fluid level (the tank's ullage) can contain a stoichiometrically explosive mixture of oxygen and methane or other similarly volatile hydrocarbon gas. Such a mixture is amenable to explosive detonation upon either arc or strong corona discharge within the tank.

Conventional metallic tanks form a Faraday cage of conducting material around both the fluid and potentially explosive ullage, thus ensuring that electric fields never approach appreciable values within the tank. However, the lack of a continuous conducting boundary resulting from the use of non-metallic tank walls permits electric fields to approach breakdown strength in response to a nearby lightning discharge. Furthermore, depending on the specific conductor geometry, enhanced local electric fields that exceed breakdown strength can occur near either small metallic objects or even dielectric objects within the dielectric region of the tank. Such conductors include small boltheads or other metallic fasteners, as well as other electrically good conduction materials within the tank (e.g., including droplets of the fluid itself and the fluid surface corners). Enhanced fields at sharp conductors can occur during either the incipient or active phase of a nearby lightning strike, but gaseous dielectric breakdown and subsequent ullage ignition will likely only occur during a nearby strike event.

Since the fluid inside the tank is often laden with salts, it can be expected to be of moderate to high ionic content. As such, its conductivity can range from a low value of ~0.001 S/m to values for heavily brackish water that can easily exceed a few S/m. Such fluids have relaxation time constants of less than ~1 nsec, but for low saline contents (i.e., spring water) this time constant can be as long as ~1 usec. In either case, these fluid masses behave as good electrical conductors on the time scale of an atmospheric electrical transient. They redistribute a surface charge event and thus effectively shield the charges on the fluid surface so they don't manifest itself within the volume of fluid itself.

However, the transient can produce a strong field within the ullage. It is well known that high electric fields occur where conductive materials form sharp corners or points. For example, the electric field around a simple spherical metallic object immersed in an otherwise uniform electric field will be up to a factor of three times as large due to the electric polarizability of the object. If the object is needle-like (for example, a rivet or long bolt) this field amplification factor can be significantly higher, readily approaching a factor of ~10× for many common fasteners. The field amplification effect occurs not only around good conductors but also at the ends of long dielectric objects, albeit to a slightly lesser extent that depends on the dielectric constant of the object. For example, for a sphere of fiberglass with a relative dielectric constant of 4.2 the amplification would be a factor of approximately two times that of the external field.

Origin of Tank Explosions: It is hypothesized that the cause of recent explosions of ullage in fracture fluid storage tanks is the result of the above field amplification near sharp ungrounded metallic objects or sharp dielectric protrusions. Rapid increases in the external field of order 2MV/m per millisecond will cause field amplification on many small dielectric and conducting objects within a non-metallic tank. The rapidity of this field change does not permit time for charge to bleed off through the insulating tank walls, and thus to null out the applied external field from the lightning transient. A rapidly increasing field that exceeds the local dielectric breakdown strength at a location in the vicinity of a lightning strike can readily produce additional localized corona or even arc discharge by exceeding the breakdown strength of the gas mixture. Note that the breakdown strength of ullage gases may also differ from that of air, as well. For example, carbon dioxide hydrogen, and helium all serve to lower the breakdown strength of air, and can contribute to a somewhat lower overall breakdown strength if present in the ullage. The presence of such sharp conductors is thus to be avoided in order to minimize field enhancement anywhere within the ullage. Alternately, the use of proper shielding can reduce the likelihood of the transient producing high fields within the ullage.

What is needed in the art is a grounding system that is highly corrosion resistant, can be secured to a roof in a non-metallic tank, and then rest on the bottom of the tank like an anchor. The present invention provides a stainless steel tripod type electrode that readily rests on the tank bottom and is connected to a roof of the tank with a cable.

SUMMARY OF THE INVENTION

The main aspect of the present invention is to provide a grounding electrode inside a volatile chemical storage tank that is flexible and easy to secure to a roof of the tank.

Another aspect of the present invention is to provide an anchor for the grounding electrode to ensure it remains on the bottom of the tank.

Another aspect of the present invention is to provide a roof anchor for the cable type electrode.

Other aspects of this invention will appear from the following description and appended claims, reference being made to the accompanying drawings forming a part this specification wherein like reference characters designate corresponding parts in the several views.

A tripod style (stainless steel) anchor is about one foot tall. A (stainless steel) cable attaches to the top of the anchor and then to a bolt type fastener on the roof. A grounding cable runs from the roof fastener to ground.

Retrofitting Non-metallic Tanks for Safety: The recommended solution to the above problem is to create a Faraday cage, even if incomplete, around the non-metallic tank. This can be done using copper grounding wire, mesh fencing, or other metallic tubing or structural material around the tank to enclose it in a metallic "birdcage" structure, along with connecting this structure to a low-impedance earth ground at the base of the tank. An incomplete Faraday cage might be formed by, e.g., two looping arches of wire or other conductor over the tank, each offset at 90 degrees to each other. Such an incomplete Faraday cage will provide a large fraction of the ultimate field rejection inside the tank obtainable using a complete metallic skin, but is far less expensive. Using four such arches at 45° azimuthal offsets will provide a significant degree of transient field rejection inside the tank.

Additional protection from charges that may be built up on the surfaces of the fluid mass can be obtained by use of a non-corrosive grounding electrode inserted into the fluid and electrically connected to the external Faraday cage conduction members. The electrode should be connected to the Faraday cage near the top of the tank at a convenient access port. This electrode, along with the moderate conductivity of the fluid itself provides a means of rapidly discharging the fluid surface—which will become charged at its surfaces when exposed to a strong transient electric field. Such charge will preferentially accumulate near the fluid mass' "corners" (e.g., the periphery of the top surface of the fluid, particularly for a concave meniscus), at which locations field amplification due to sharp dielectric corners can occur. The electrode, if grounded, will also be partially effective as the Faraday cage since it will also serve to null the vertical component of the field within the ullage. In fact, since this electrode needs to be grounded, there will always be at least one conductor of the Faraday "birdcage" going to ground outside of the tank. A partial Faraday cage will thus necessarily be built when this conductor is installed.

Such an electrode needs to be highly corrosion resistant (e.g., stainless steel) to maintain and provide high conductivity to the fluid mass. A large contact area is desired to keep the overall time constant of the system shorter than the time scale of the transient strike event. This time constant is governed by the geometry of the fluid surfaces and the effective resistance of the fluid surface to the conducting electrode.

In general, it is not recommended that any additional sharp metallic objects be placed inside the tank, and especially within the region of the ullage. Such additional metallic objects—whether if grounded by connection to the electrode conductor or ungrounded-can serve to enhance field strengths and initiate discharge within the ullage. Therefore, the geometry of this conducting electrode should be that of a smooth cylinder, lacking any sharp corners or points, for the express purpose of minimizing the potential of corona discharge within the exposed ullage. Any sharp features on the electrode to the fluid or to induce corona within the ullage, may serve to produce some shielding space charge within the ullage but at the greater risk of producing an arc discharge within the ullage. Depending on the volume and duration of this discharge the presence of splines within the ullage will serve to increase risk of an explosion above and beyond that of a purely cylindrical conductor. For this purpose, a smooth walled stainless steel pipe serves as an ideal electrode.

While it is argued that sharp splines radiating from an electrode increase risk of igniting the ullage, it is also the case that they serve to reduce the resistance of the electrode to the fluid surfaces in which they are immersed, but only insignificantly. While a "wire brush" electrode has far more geometric area by which to contact the fluid than a cylindrical electrode of comparable diameter, the electrical potential within the vicinity of the wire radials is effectively a constant as a result of the screening of any field in the fluid by the wires themselves. Accordingly, the wires improve the overall conductivity of the electrode to the bulk fluid mass by no more than about 2-3 times relative to the conductivity provided by a smooth surface cylindrical electrode, of roughly the same diameter.

The tank and electrode (whether wire brush or pipe) form a coaxial resistive-capacitive circuit. Tests to determine the electrode resistance were conducted at LEC, Longmont, Colo., using both distilled and salt water solutions. Care was taken to derive the Thevenin resistance in order to compensate for any cell potentials that may have been formed by the tank and electrode circuit. In order to determine the effective resistance of the electrode to the tank, $RE=RL\,[(V1/V2)-1]$ is used in FIGS. 1a,1b where:

RE=Electrode resistance
RL=Resistance of load resistor
V1=Open circuit voltage
V2=Closed circuit voltage The results for distilled and salt water resistance testing are provided in Tables 1 and 2, respectively. In the case of the cylindrical electrode, a hollow stainless steel pipe with plugged bottom was used. This arrangement precluded additional conductivity to the fluid due to currents from the inner walls of the pipe.

TABLE 1

Comparison of internal resistances for distilled water using wire-brush and smooth cylinder conductors in a coaxial tank.

| Pipe: 1" Diameter, Plugged Hole | | | | |
|---|---|---|---|---|
| $V_1$ | $V_2$ | $R_L$ | | |
| | $R_L$ = 9868 Ohm | | | |
| 0.789 | 0.530 | 4822.287 | | |
| 0.778 | 0.525 | 4755.436 | | |
| 0.772 | 0.518 | 4838.749 | | |
| | | | Avg = | 4805.491 Ohm |
| | $R_L$ = 9868 Ohm | | | |
| 0.774 | 0.394 | 4779.898 | | |
| 0.762 | 0.384 | 4878.563 | | |
| 0.756 | 0.379 | 4929.847 | | |
| | | | Avg = | 4862.769 Ohm |
| | | | Overall Avg. | 4834.130 Ohm |
| | | | Ratio of pipe to wire-brush: | 1.9 |
| Wire Brush: 0.5" Diameter cable with 2.5" wire bristles | | | | |
| $V_1$ | $V_2$ | $R_L$ | | |
| | $R_L$ = 9868 Ohm | | | |
| 0.853 | 0.663 | 2827.934 | | |
| 0.837 | 0.662 | 2608.610 | | |
| 0.827 | 0.650 | 2687.132 | | |
| | | | Avg = | 2707.892 Ohms |
| | $R_L$ = 4956 Ohm | | | |
| 0.834 | 0.551 | 2545.459 | | |
| 0.830 | 0.549 | 2536.678 | | |
| 0.826 | 0.552 | 2460.043 | | |
| | | | Avg = | 2514.060 Ohms |
| | | | Overall Avg. | 2610.976 Ohms |

The tests show a near equivalence of the wire-brush and cylindrical electrode resistances, in spite of the larger diameter/surface area of the wire brush electrode. The near-equality of these resistances is the result of a near-equipotential region established by the brush wires within the interstices of the wire brush electrode.

Additional laboratory tests of the discharge time constant of a high voltage charge on a tank/electrode system further reveal that the resistive-capacitive (RC) decay time constant is not significantly different for the wire brush electrode than for the smooth cylinder electrode (FIGS. 1a, 1b). It is seen that the discharge of the capacitive system is not governed primarily by the resistance presented by the electrode, but rather by the bulk properties of the fluid and the geometry of the tank. As a result, there is no significant advantage to using a wire brush electrode in discharging the tank system.

FIG. 2 compares the results of transient discharge testing on a simulated storage tank using two types of test electrodes. The test electrodes were comprised of a roughly 5 inch diameter stainless steel wire brush and a 1 inch diameter hollow plugged stainless steel pipe for the cylindrical electrode. Both electrodes were submerged coaxially in a tank filled with distilled water. The electrodes were submerged to the same depth and tested separately.

From the distilled water testing for the smooth cylinder and wire brush, the data clearly shows that for both of the two electrode geometries the transient response exhibits an envelope that decays at approximately the same rate. It can be gathered from these decay rates that the discharge of this capacitive system is not governed by the resistance presented by the specific type of electrode, but by other either bulk properties of the fluid or the geometry of the tank. These measurements provide further evidence that there is no advantage of the wire brush in discharging the tank system.

FIG. 3 compares the same discharge test results for a solution of NaCl and water comparable in salinity to that of seawater (about 4 S/m). The devices were submerged to the same depth and tested separately. The brush data in the discharge curve exhibits a near-critically damped oscillatory behavior-as can be seen in the overshoot and decay present at about 35 usec. The wire brush shows an underdamped response that is the result of an increase of series inductance, with the capacitance of the system between the brush and cylindrical electrodes and tank wall assumed to remain the same. In contrast, the cylindrical electrode shows critical damping representative of less inductance-as would be expected from a hollow tube. The increased inductance of the wire brush is due to the many tiny wires along the length of the brush along with the comparatively small diameter cable that is used to hold these tiny wires in place. While the cylindrical electrode appears to display a longer discharge time, the oscillation of the brush discharge waveform tends to obscure the similarity of the electrode resistances.

The test data corroborate the hypothesis that the wire brush does not appreciably reduce the resistance to the tank walls, and thus does not aid to any appreciable extent in discharge of the tank. These observations are consistent with the theory that the wire brush forms a single equipotential surface of approximate diameter of the bristles themselves, and thus the extra surface area provided by the wires does not reduce the resistance of the electrode to the bulk fluid.

Conclusion:

The tank resistance and discharge analyses show that the discharge rate for a wire brush electrode is not appreciably different than for a smooth surface cylindrical electrode of similar diameter. Two conclusions can be drawn:

1. With regard to the resistances of the electrodes to the bulk fluid and their ability to discharge a surface charge, they are nearly equivalent, although since the cylindrical electrode exhibits less series inductance, it is preferred.

2. The supposed benefit that the splines would provide inside the tank does not outweigh the risks associated with the possible generation of corona discharge or arcing. Due to the potential for igniting the ullage above the fluid and the insignificant improvement in fluid conductance, such wire brush electrodes are thus not recommended. In contrast, the ability to neutralize surface charge on the surfaces of the fluid and thus to mitigate field enhancement near electrically exposed edges of the fluid mass (i.e., at the periphery of the top surface of the fluid mass) is better served using a non-corrosive cylindrical electrode running from the top of the tank down to the bottom of the fluid. This electrode, along with primary means of electric field reduction in the ullage using even an incomplete external Faraday "birdcage" can be expected to provide the highest reliability means of retrofitting non-metallic chemical storage tanks for lightning safety.

The problem with the prior art stainless steel non-corrosive cylindrical pipes running from the top of the tank to the bottom of the tank is cost of materials and cost of installation. These tanks can be more than twenty feet high. Thus, a costly stainless steel pipe must be custom sized then placed down inside the tank from a port in the roof. Then the pipe must be attached to a metal roof without welding.

The present invention achieves the same grounding efficiency at greatly reduced cost. The invention comprises a (stainless steel) pedestal shaped anchor which is lowered to the bottom of the tank through a port in the roof. In addition the invention comprises comprises, a simple coupling which is bolted to the port hatch on the roof. A grounding cable is run from the roof coupling to ground outside the tank.

BRIEF DESCRIPTION OF THE DRAWINGS

Other aspects of this invention will appear from the following description and appended claims, reference being made to the accompanying drawings forming a part of this specification wherein like reference characters designate corresponding parts in the several views.

DETAILED DESCRIPTION OF THE DRAWINGS

Figure 1B:
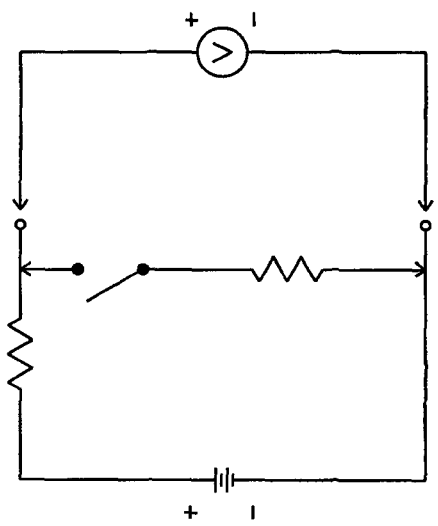
FIG. 1b (prior art) is a chart of a circuit sketch of the FIG. 1a tank with the rod type electrode and its electrical equivalent.
Figure 1A:
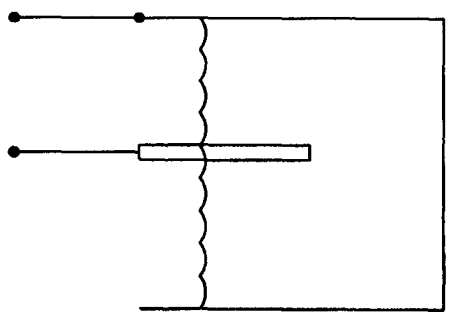
FIG. 1a (prior art) is a cross sectional view of a tank with a coaxial cable immersed in the fluid.
Figure 2:
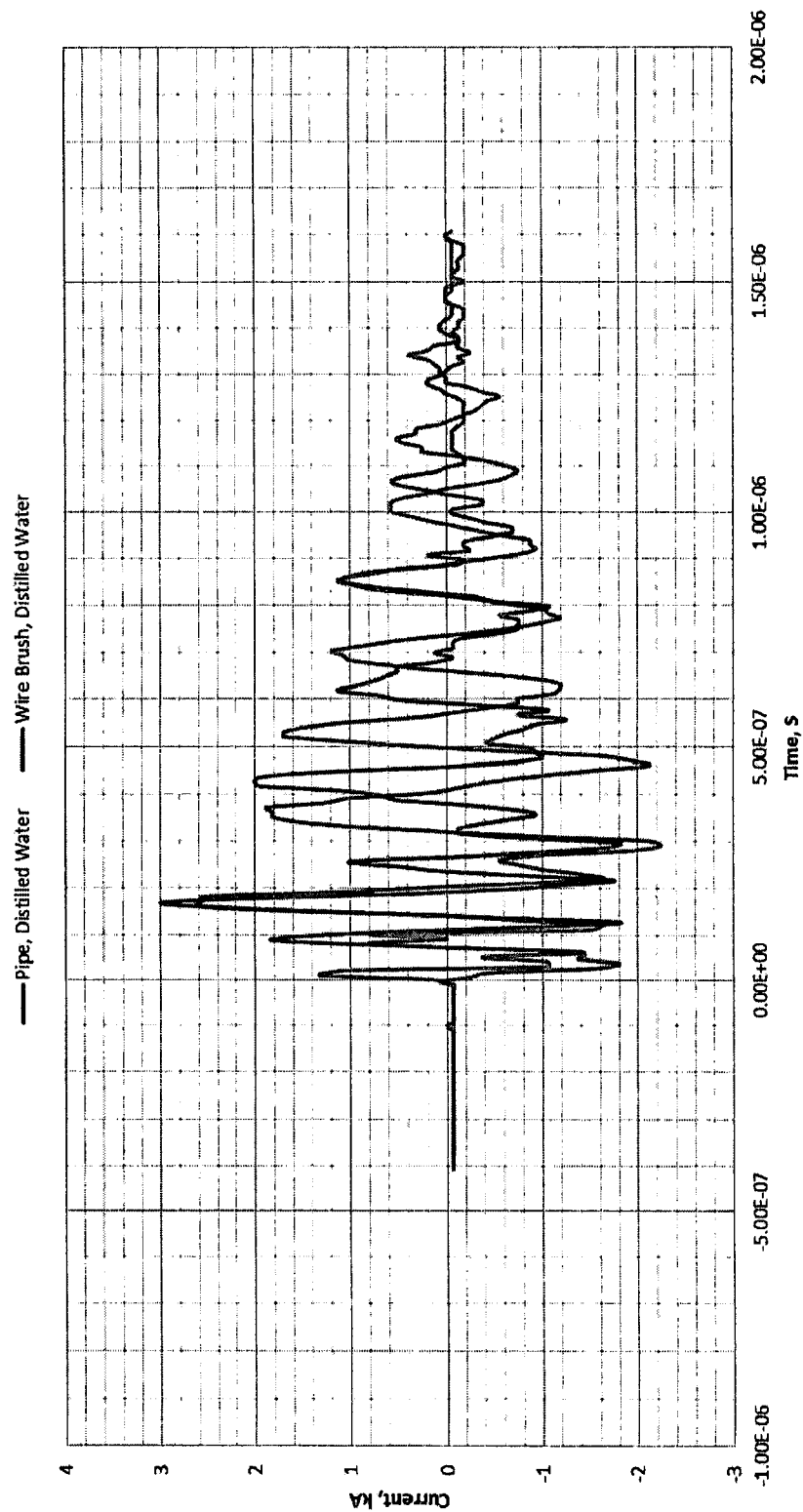
FIG. 2 (prior art) is a chart of transient discharge of a smooth pipe versus a wire brush electrode.
Figure 3:
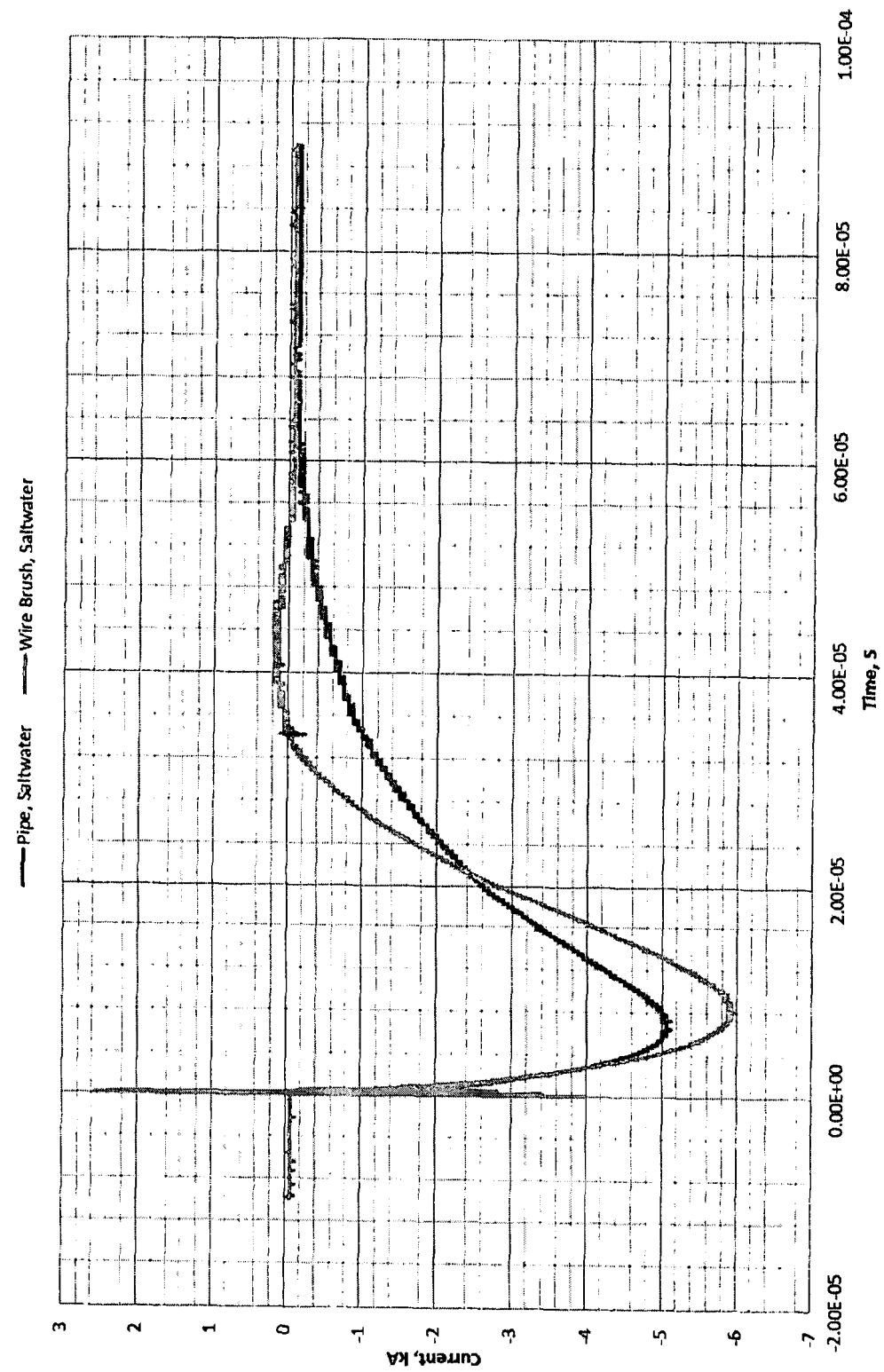
FIG. 3 (prior art) is a chart of a transient discharge in salt water of a smooth pipe versus a wire brush electrode.
Figure 4:
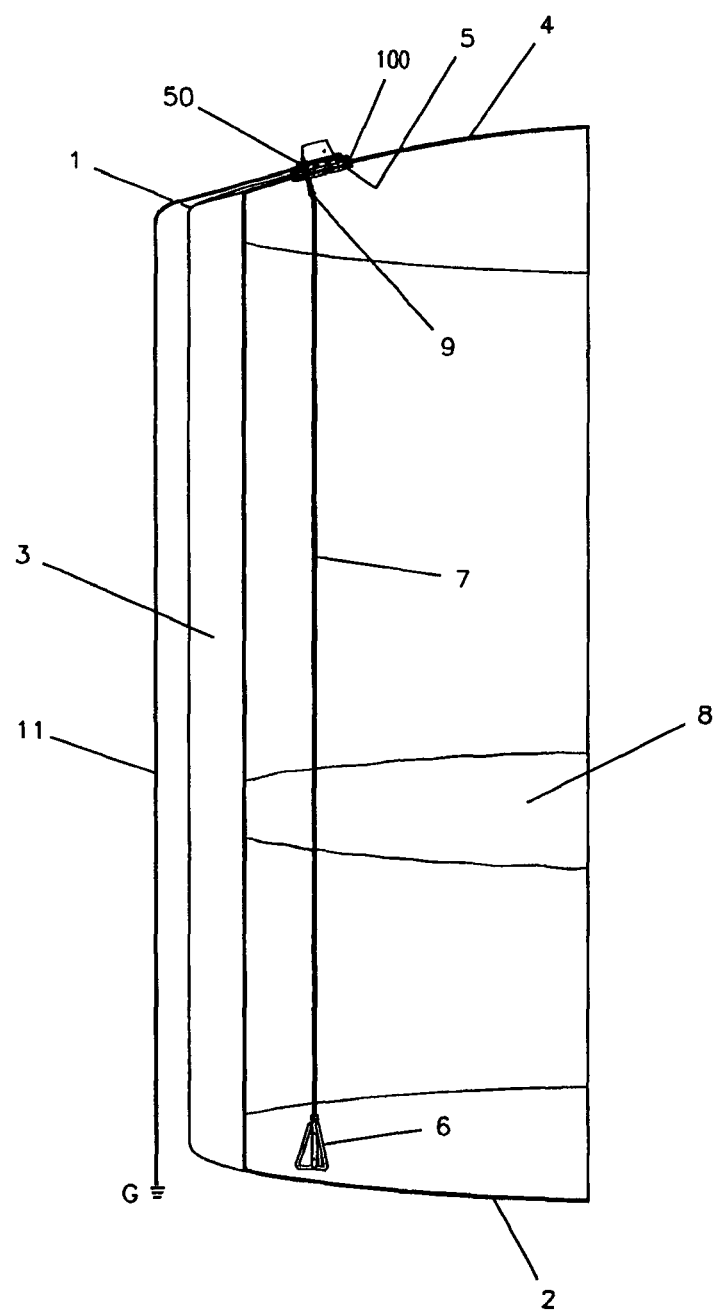
FIG. 4 is a side elevation view of the preferred embodiment installed.
Figure 5:
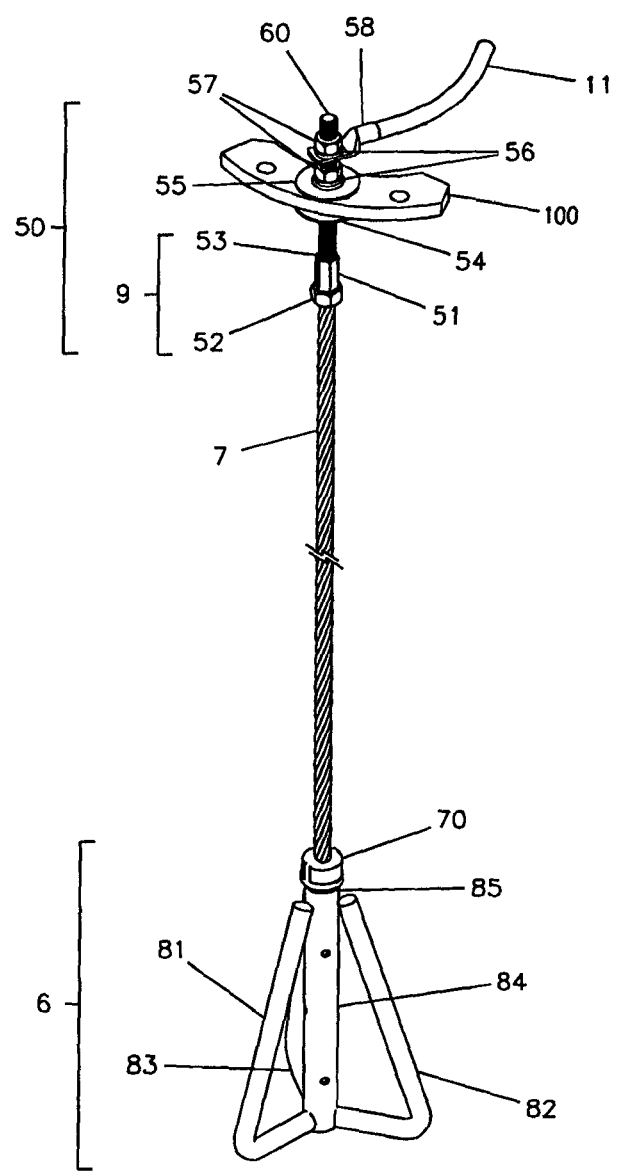
FIG. 5 is a top perspective view of the embodiment shown in FIG. 4.
Figure 6:
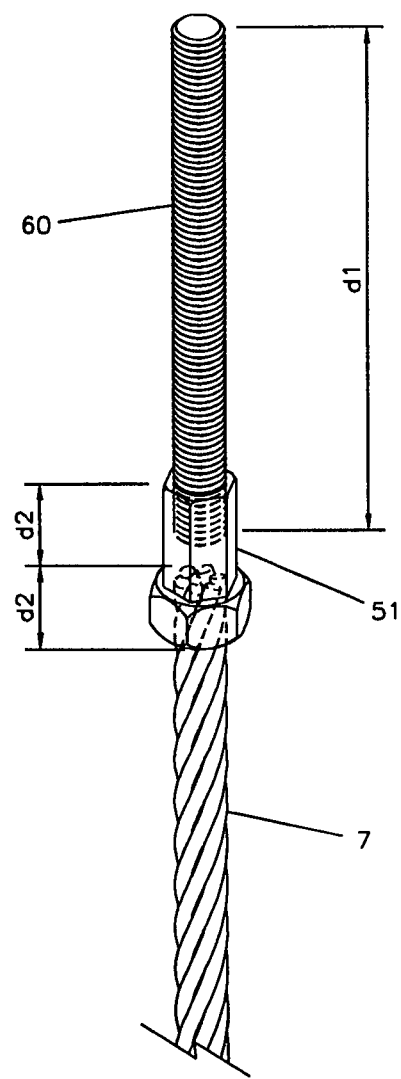
FIG. 6 is a side elevation view of a cable to roof coupling element.
Figure 7:
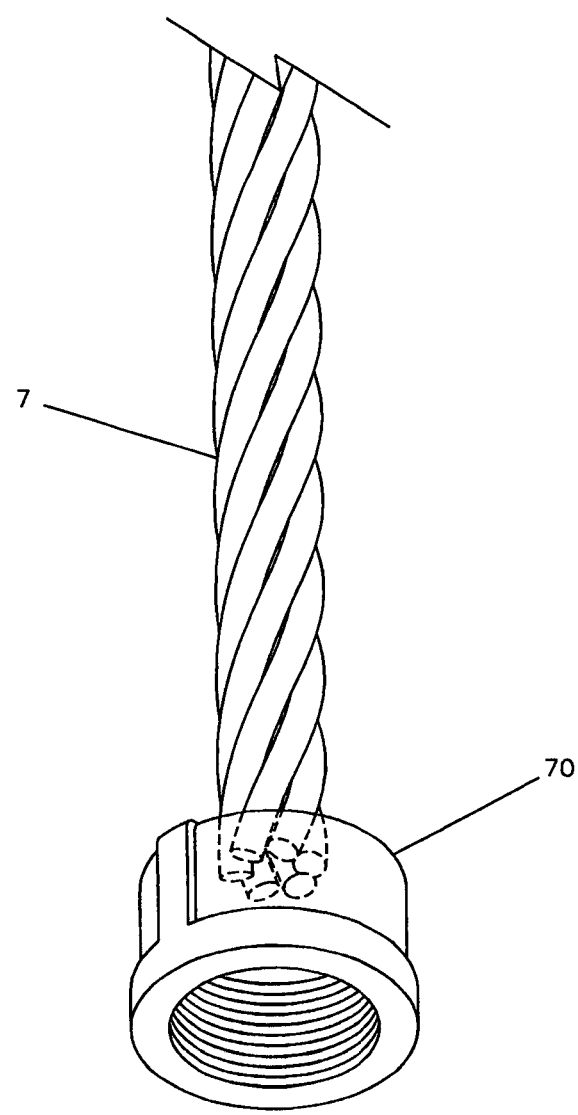
FIG. 7 is a bottom perspective view of a cable to anchor coupling.
Figure 8:
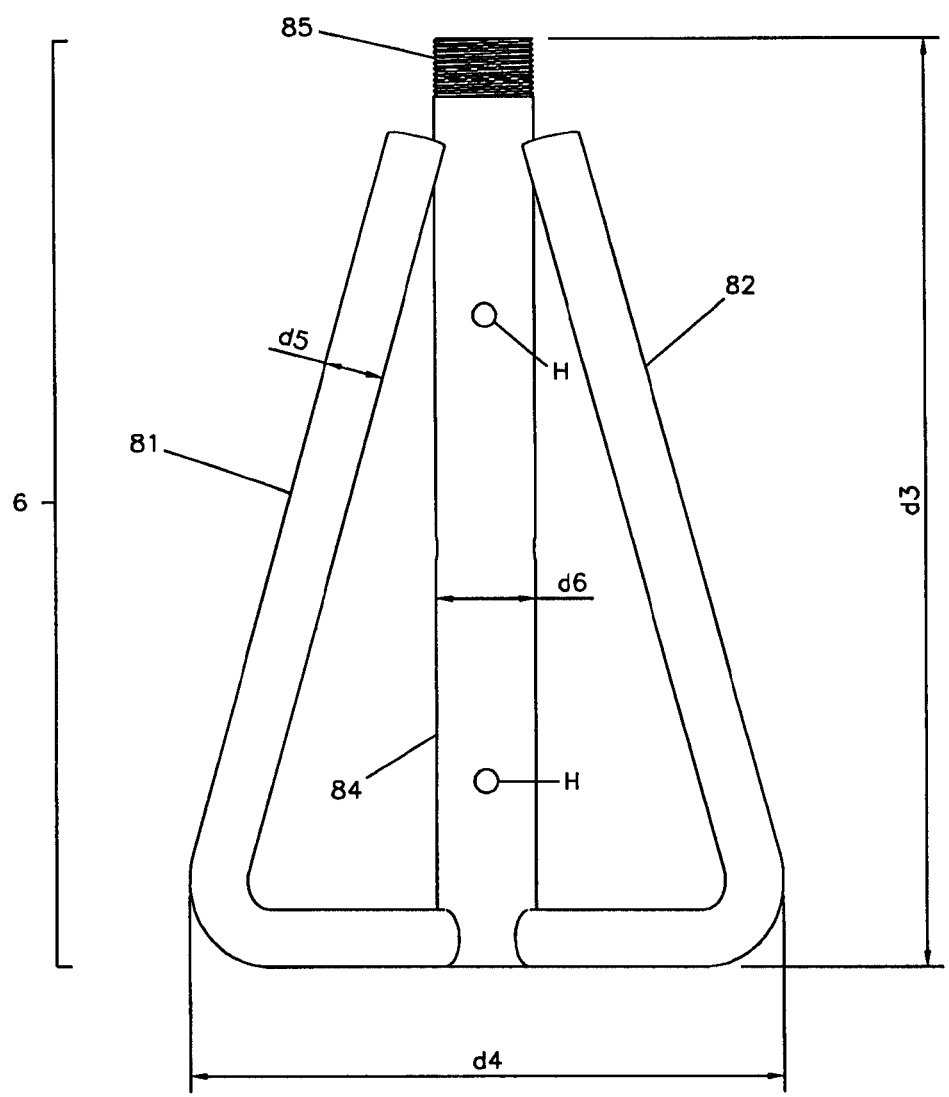
FIG. 8 is a side elevation view of the anchor.

Referring first to FIG. 4 an above ground chemical storage tank 1 has a bottom 2, a cylindrical side wall 3 and a top 4. A tank access hatch 5 provides access to the inside of tank 1.

A (preferably stainless steel) anchor 6 has been fed through hatch 5 via a (preferably stainless steel) cable 7. Anchor weights from about three pounds to about ten pounds, with some embodiments weighing from about four pounds to about five pounds. The anchor 6 has passed through the fluid surface 8 so as to rest on the bottom 2 of tank 1. The top 9 of cable 7 has been connected to a connector assembly 50 which is bolted to a hatch plate 100. A ground cable 11 connects the connector assembly 50 to ground G.

Referring next to FIGS. 5-8 the connector assembly 50 consists of a cable cap 51 that has a flange 52 of a wider diameter than the sheath 53. A washer 54 rests on the flange 52. The hatch plate 100 rests on the washer 54. An upper washer 55 rests on the hatch plate 100. A (lock) washer 56 rests on the upper washer 55. A nut 57 clamps the hatch plate 100 against the flange 52. A lug 58 is locked against the nut 57 by another upper nut 57. The bolt 60 is secured in the cable cap 51. The grounding cable 11 is clamped in the lug 58.

The cable 7 may be a seven wire stainless steel cable one half inch in diameter. The bolt 60 may be six inches long (d1). d2 equals ⅝ inch in FIG. 6.

The bottom of cable 7 has a threaded coupler 70 that is welded on cable 7 so as to thread onto male connector 85 of the central hollow leg 84 of the anchor 6. Anchor 6 is stabilized by solid legs 81, 82, 83. Nominal dimensions are d3=10 inches, d4=7 3/16 inches, d5=⅝ inches, d6=1 3/64 inches. Holes H allow fluid to fill the hollow leg 84.

Figure 9:
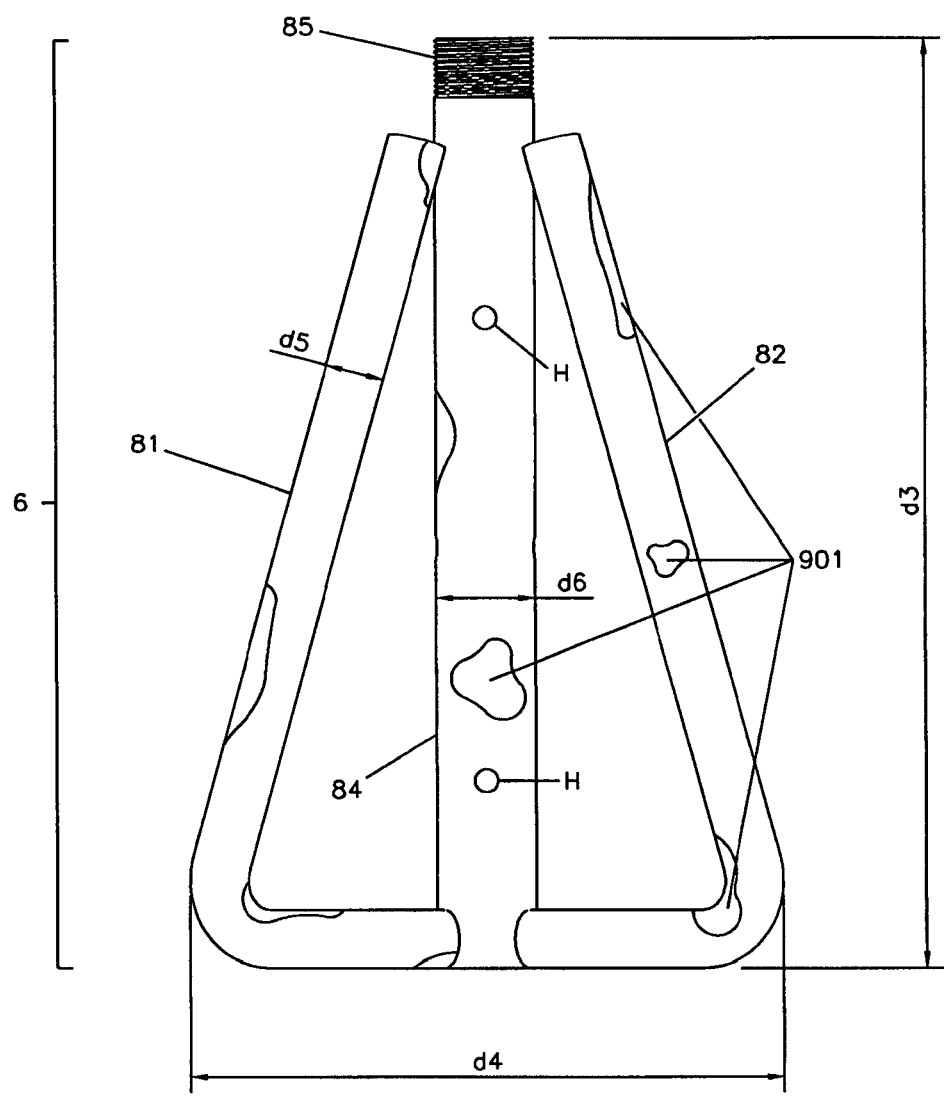
FIG. 9 is a side elevation view of the invention several months after installation into a tank housing corrosive liquid.

Referring next to FIG. 9 the anchor 6 has been in use for over a year in a methane infused fluid. All the legs 81-84 are intact without noticeable corrosion. Spots of debris 901 have built up, but have not affected the performance of the anchor 6.

Figure 10:
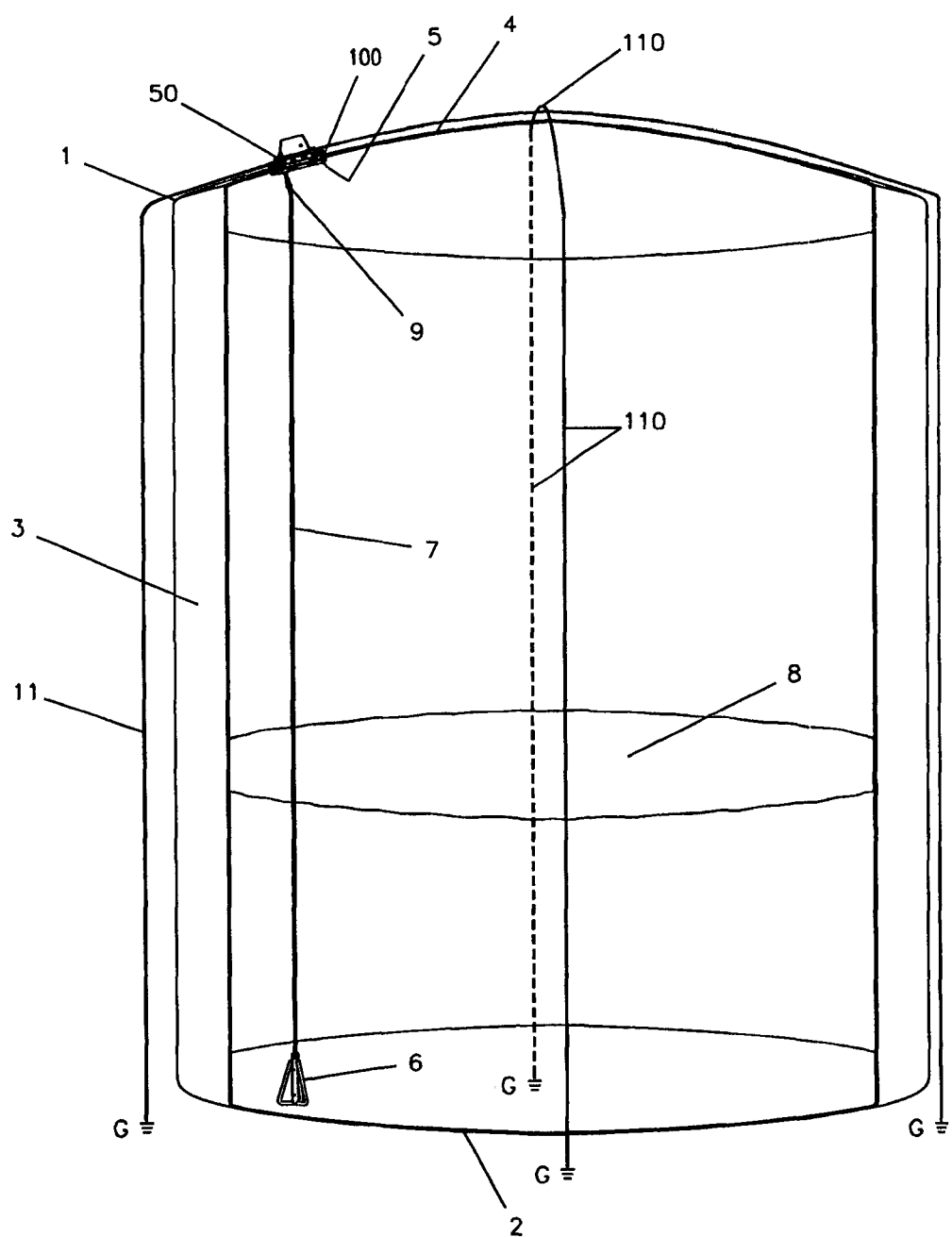
FIG. 10 is the same view as FIG. 4 with a partial Faraday cage.

Referring next to FIG. 10 a second looping arch of a conductive wire (nominally copper) is labeled 110. The loop 110 is offset about 90° from the first loop 11 and 7. This second loop (and potentially more) creates a Faraday birdcage provides a significant fraction of the ultimate field rejection inside the tank that a complete metallic skin would provide.

Although the present invention has been described with reference to the disclosed embodiments, numerous modifications and variations can be made and still the result will come within the scope of the invention. No limitation with respect to the specific embodiments disclosed herein is intended or should be inferred. Each apparatus embodiment described herein has numerous equivalents.

We claim:

1. A method to mitigate an electric discharge in a non-metallic chemical storage tank, the method comprising the steps of:
   lowering a conductive anchor via a conductive cable through a hole in a roof of a chemical storage tank;
   resting the conductive anchor on a bottom of the chemical storage tank;
   attaching a top of the cable to an anchor on the roof;
   running a ground wire from the anchor to a ground;
   making the conductive cable and the anchor from stainless steel and making the conductive cable a smooth sided multi-wire cable; and
   forming the anchor from at least three angled legs, each leg having a base to rest on a flat surface and an angled rod to attach to a central post.

2. The method of claim 1 further comprising the step of forming a hatch plate having a cable anchor on the roof and attaching the top of the conductive cable to the anchor on the hatch plate.

3. The method of claim 1 further comprising the step of forming a cable cap on a top of the cable, said cable cap having a lower flange that is wider than an upper sheath, said upper sheath securing a bolt suited to connect to the ground wire and the anchor on the roof.

4. The method of claim 1 further comprising the step of forming a partial Faraday birdcage by attaching at least one more ground wire to the anchor on the roof at about a right angle to the ground wire and parallel thereto.

5. A method to mitigate an electric discharge in a non-metallic chemical storage tank, the method comprising the steps of:
   lowering a conductive anchor via a conductive cable through a hole in a roof of a chemical storage tank;
   resting the conductive anchor on a bottom of the chemical storage tank;
   attaching a top of the cable to an anchor on the roof;
   running a ground wire from the anchor to a ground; and
   forming the anchor from at least three angled legs, each leg having a base to rest on a flat surface and an angled rod to attach to a central post.

6. The step of claim 5 further comprising the step of attaching the central post to each base.

7. The step of claim 6 further comprising the step of forming the anchor to weigh at least about four pounds to about ten pounds.

8. The step of claim 7 further comprising the step of forming threads for a cable connector on top of the central post.

9. A grounding anchor for a non-metallic fluid tank used for storing a methane-infused fluid, the grounding anchor comprising:
   a central vertical rod having a threaded top;
   at least three solid stainless steel legs each having a horizontal base segment attached to the central vertical rod and having an angled upper segment connected to the central vertical rod; and
   said grounding anchor having a weight of at least about four pounds and a maximum weight of about ten pounds.

10. The grounding anchor of claim 9, wherein the central vertical rod is hollow and has holes.

11. The grounding anchor of claim 9 further comprising a stainless steel cable with a connector cap threaded to the threaded top, said stainless steel cable connected to an earth ground.

12. A grounding system to ground a non-metallic fluid tank, the grounding system comprising:
   an upper tank anchor affixed to an upper segment of a non-metallic fluid tank;
   a conductive cable connected to the upper tank anchor at a top end;
   said conductive cable having a length to allow a bottom end to reach a bottom of the non-metallic fluid tank from the upper tank anchor;
   a conductive metal anchor attached to the bottom end of the conductive cable;
   said conductive metal anchor having a weight of at least about four pounds to a weight of about ten pounds;

a grounding wire connected to the upper tank anchor and connected to an earth ground; and wherein the conductive metal anchor further comprises a stainless steel tripod having at least three angled legs forming a base and a central post forming a connector to the conductive cable.

13. The grounding system of claim 12, wherein the conductive cable is made of stainless steel and has a sheath holding a bolt on its top end which connects to the conductive metal anchor and the grounding wire.

14. The grounding system of claim 12, wherein the tripod's at least three angled legs are solid and have a short horizontal section attached to the central post which forms the base, each short horizontal section having a longer angled upper rod attached to the central post.

15. The grounding system of claim 14, wherein the connector on the central post further comprises threads which receive a female threaded coupler on the bottom end of the conductive cable.

16. The grounding system of claim 12 further comprising at least a second grounding wire parallel to the grounding wire and oriented about 90° away from the grounding wire so as to form a partial Faraday birdcage by having a grounding wire inside the tank reaching the bottom of the tank to form a grounding loop.

\* \* \* \* \*